United States Patent
Schuster et al.

(10) Patent No.: US 7,256,581 B2
(45) Date of Patent: Aug. 14, 2007

(54) MAGNETIC RESONANCE APPARATUS WITH DISPLACEABLE C-ARM MOUNT FOR AN ADDITIONAL GRADIENT COIL UNIT

(75) Inventors: Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/417,470

(22) Filed: May 3, 2006

(65) Prior Publication Data

US 2006/0261813 A1 Nov. 23, 2006

(30) Foreign Application Priority Data

May 3, 2005 (DE) .................. 10 2005 020 687

(51) Int. Cl.
*G01V 3/00* (2006.01)
(52) U.S. Cl. ..................... 324/318; 324/322
(58) Field of Classification Search ............... 324/318, 324/322, 321
See application file for complete search history.

(56) References Cited

U.S. PATENT DOCUMENTS

| 5,783,943 A * | 7/1998 | Mastandrea et al. ........ 324/318 |
| 6,864,683 B2 | 3/2005 | Schuster et al. |
| 2006/0137177 A1* | 6/2006 | Schuster et al. .............. 29/729 |

FOREIGN PATENT DOCUMENTS

DE  101 41 405  4/2003

\* cited by examiner

*Primary Examiner*—Louis M. Arana
(74) *Attorney, Agent, or Firm*—Schiff Hardin LLP

(57) ABSTRACT

A magnetic resonance apparatus has a scanner having a basic field magnet, a stationary gradient coil unit, an antenna system for acquisition of magnetic resonance signals, and a second gradient coil unit that can be introduced into an examination chamber of the scanner. The second gradient coil unit is arranged on a displaceable mounting attached outside of the examination chamber. The mounting is fashioned as a C-arm that can be moved along one axis.

9 Claims, 2 Drawing Sheets

MAGNETIC RESONANCE APPARATUS WITH DISPLACEABLE C-ARM MOUNT FOR AN ADDITIONAL GRADIENT COIL UNIT

BACKGROUND OF THE INVENTION

1. Field of the Invention

The present invention concerns a magnetic resonance apparatus of the type having a scanner with a basic field magnet, a stationary gradient coil unit, an antenna system for acquisition of magnetic resonance signals and a second gradient coil unit that can be introduced into an examination chamber of the scanner.

2. Description of the Prior Art

For specific magnetic resonance examinations, insert gradient coils (which are also designated as local gradient coils) are introduced into the existing gradient coil of an MRI scanner that is used for whole-body examinations. In comparison to whole-body gradient coils, these insert gradient coils are advantageous with regard to inductance, slew rate, the maximum possible gradient field strength and the stimulation of the patient within smaller external diameters. Insert gradient coils are used when only a specific body part, for example the head of a patient, is to be subjected to a magnetic resonance examination.

Such a second gradient coil unit, the insert gradient coil, is normally manually inserted into scanner. An insert gradient coil, however, can weigh up to 250 kg, such that the handling thereof and the mounting and removal thereof can be cumbersome and complicated.

A magnetic resonance apparatus with a movable gradient coil unit is disclosed in DE 101 41 405 A1. The gradient coil unit is designed as an additional gradient coil that can be introduced into the tube-shaped examination chamber of the first gradient coil unit. For this purpose, in the region of the examination chamber a support device with rails is provided in order to move the second gradient coil unit into the examination chamber as needed and to remove it again after the conclusion of the examination. It is disadvantageous that the guides and rails for the support device are permanently located in the examination chamber even when the second gradient coil unit is not used.

An insertion device for gradient coils is known from DE 102 29 489 A1. The local gradient coil is mounted on a boom that is fastened on a movable carrier unit arranged outside of the magnetic resonance apparatus and can be displaced relative to the carrier unit. This movable carrier unit has a not-insignificant space requirement, such that the accessibility to this side of the magnetic resonance apparatus is limited.

SUMMARY OF THE INVENTION

An object of the present invention is to provide a magnetic resonance apparatus in which a second gradient coil unit can be inserted into the examination chamber and completely removed from the examination chamber without the accessibility being impaired.

This object is achieved in accordance with the invention by a magnetic resonance apparatus of the aforementioned type wherein the mounting is a C-arm that can be moved along one axis.

The mounting in accordance with the invention replaces the rails and other guides of the conventional system that is permanently located in the examination chamber. By contrast, the second gradient coil unit of the inventive magnetic resonance apparatus can be moved out from the examination chamber and completely extracted by means of the displaceable mounting after the implemented magnetic resonance examination, such that no components whatsoever are disruptively present in the examination chamber.

The mounting of the inventive magnetic resonance apparatus is a C-arm that can be moved along one axis. Such a C-arm can have two essentially horizontal carrier segments that are connected with one another by a vertical perpendicular carrier segment, the length of the carrier segments being adapted to the scanner of the inventive magnetic resonance apparatus. The movable second gradient coil unit is arranged on the underside of the two horizontal carrier segments, while the upper horizontal carrier segment is borne in a displaceable manner on the upper side of the base unit. The second gradient coil unit can accordingly be shifted into the examination chamber and subsequently removed again from there as needed by means of the-mounting fashioned as a C-arm.

A particularly secure and reliable displacement results when the C-arm comprises a roll guide on the upper horizontal carrier segment, the rollers of which are borne on a guide rail mounted on the base unit. If applicable, a possibility for vertical adjustment of the C-arm (and therewith of the second gradient coil unit) can be provided at the guide rail.

In a preferred development of the invention, the mounting of the inventive magnetic resonance apparatus can be articulated and can be pivoted on an axis between a park (standby) position and a working position. This axis is situated essentially parallel to the displacement path of the mounting. In this embodiment, the second gradient coil unit outside of the examination chamber can be approximately folded away around the guide rail as a pivot axis. It is advantageous when the second gradient coil unit and the C-arm in this park position are at least partially covered by the enclosure (housing) of the scanner.

In order to make handling of the inventive magnetic resonance apparatus easier, the displacement of the mount (in particular of the C-arm) can be limited on one or both sides by advantageously-adjustable stops. The available displacement path thus can be set exactly.

The mounting, in particular the C-arm, can be capable of being positioned along its displacement path by means of an electrical drive actuator. The positioning can ensue with a control device by means of controller software. The mounting (fashioned as a C-arm) can include control and/or power supply lines and can be designed as self-contained (modular) system that can also be used to retrofit an existing magnetic resonance apparatus.

DESCRIPTION OF THE PREFERRED EMBODIMENTS

Figure 1:
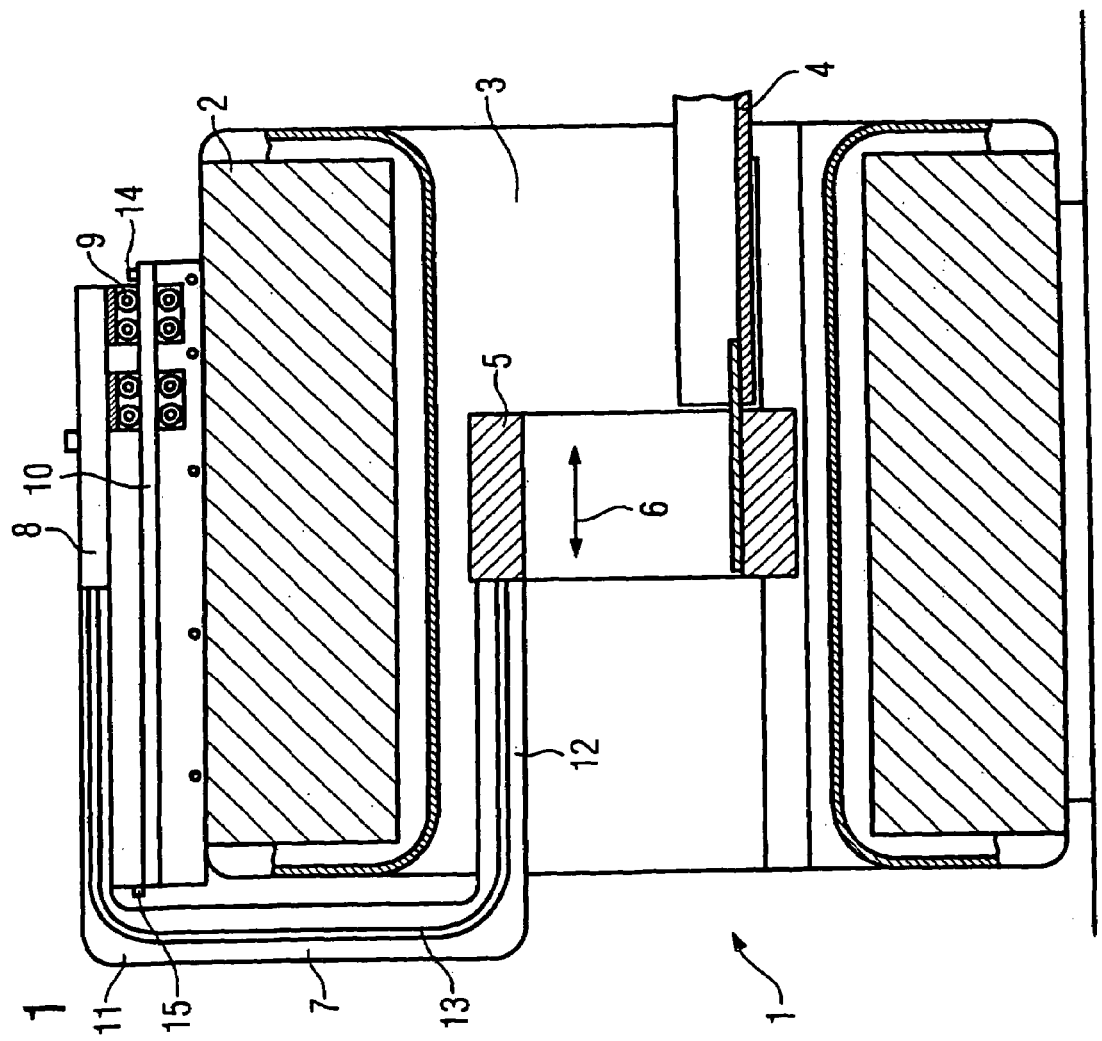
FIG. 1 shows an inventive magnetic resonance apparatus with a second gradient coil unit in the working position.

The magnetic resonance apparatus 1 shown in FIG. 1 has a scanner 2 inside which are arranged a basic field magnet, a stationary first gradient coil unit and an antenna system for acquisition of magnetic resonance signals (not shown). In the magnetic resonance apparatus 1, rapidly-switched gradient fields that are generated by the first gradient coil unit are superimposed in a known manner on a static basic magnetic field that is generated by the basic field magnet. Radio-frequency signals for exciting magnetic resonance signals are radiated into the examination subject by a radio-frequency system; the resulting magnetic resonance signals being acquired in order to create magnetic resonance images therefrom.

The scanner 2 of the magnetic resonance apparatus 1 has a tube-shaped examination chamber 3 in which a patient can be positioned on a patient bed 4.

A magnetic resonance examination can be implemented with the first gradient coil unit arranged in the scanner 2, but instead of this a second gradient coil unit 5 that can be inserted into the examination chamber 3 is used for specific examinations. The second gradient coil unit can be moved along the displacement path (indicated by the double arrow 6). As is to be seen in FIG. 1, the second gradient coil unit 5 can be used, for example, for magnetic resonance examinations of the head of a patient.

The second gradient coil unit 5 is attached on a mounting that is fashioned as a C-arm 7 in the exemplary embodiment. The C-arm 7 has an upper horizontal carrier segment 8 on whose end a roll guide 9 is attached. The rollers of the roll guide 9 run on a stationary guide rail 10 that is attached to the upper side of the base unit 2. The vertical position of the C-arm 7 (and therewith the vertical position of the second gradient coil unit 5) can be aligned via an adjustment device (not shown in detail).

A vertical carrier segment 11 connects to the horizontal carrier segment 8 and a lower horizontal carrier segment 12 connects to the vertical carrier segment 11. Supply lines 13 with signal lines and the power supply for the second gradient coil unit 5 are located on or in the C-arm 7.

In the exemplary embodiment shown in FIG. 1, the C-arm can be manually displaced along the guide rail 10 between stops 14, 15. In other embodiments, the displacement can also ensue by means of a drive, for example an electromotor. This drive can be activated by a controller operated by software.

Figure 2:
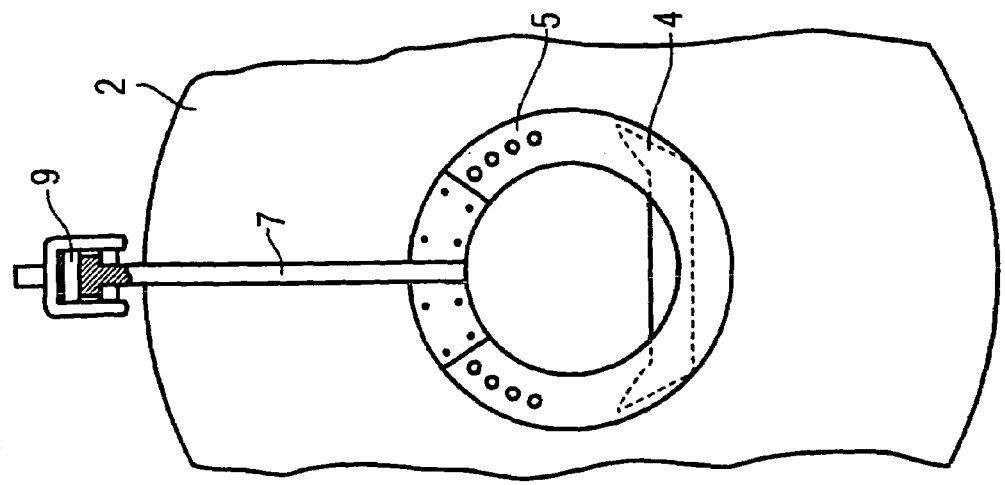
FIG. 2 is a side view of the magnetic resonance apparatus of FIG. 1.

FIG. 2 shows the magnetic resonance apparatus 1 of FIG. 1 in a side view.

Figure 3:
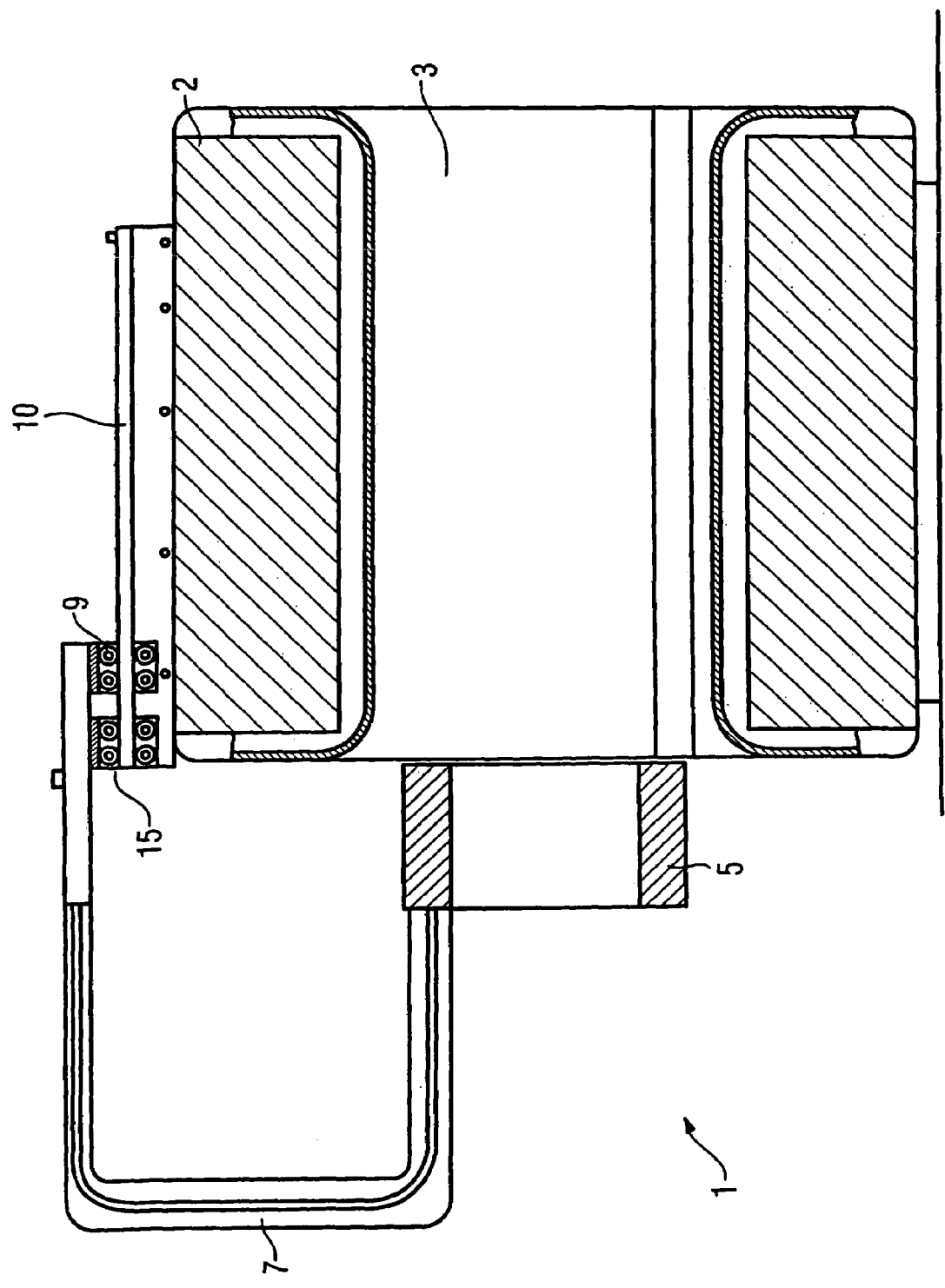
FIG. 3 shows the magnetic resonance apparatus shown in FIG. 1 with the second gradient coil unit in the park position.

In the view of the magnetic resonance 1 shown in FIG. 3, the second gradient coil unit 5 is located in the park position. In this position, the C-arm 7 (and thus also the second gradient coil unit 5) are located in their maximal deployed (extended) position, in which the rollers of the roll guide 9 abut the stop 15. The second gradient coil unit 5 is located outside of the examination chamber 3, such that the chamber 3 can be used without interference. In other embodiments, the C-arm 7 with the second gradient coil unit 5 can be pivoted to the side around an axis that is oriented parallel to the guide rail 10, such that the C-arm is covered by an enclosure of the magnetic resonance apparatus 1.

The C-arm 7 with the second gradient coil unit 5 forms a self-contained system that can be used to retrofit an existing magnetic resonance apparatus.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
    a magnetic resonance scanner containing a basic field magnet, a stationary gradient coil unit, and an antenna system for acquiring magnetic resonance signals within an examination volume, said magnetic resonance scanner having an exterior, and an interior bore in which said examination volume is located;
    a further gradient coil unit introduceable into, and removable from, said examination volume in said magnetic resonance scanner via said bore; and
    a displaceable C-arm mount for said further gradient coil unit, said C-arm mount being attached to said further gradient coil unit and being displaceable along said exterior of said magnetic resonance scanner.

2. A magnetic resonance apparatus as claimed in claim 1 wherein said C-arm mount comprises two substantially horizontal carrier segments connected to each other by a vertical carrier segment, one of said horizontal carrier segments being displaceable along said exterior of said magnetic resonance scanner and the other of said horizontal carrier segments being attached to said further gradient coil unit.

3. A magnetic resonance apparatus as claimed in claim 2 wherein said one of said horizontal carrier segments is displaceable along said exterior of said magnetic resonance scanner at a top of said magnetic resonance scanner.

4. A magnetic resonance apparatus as claimed in claim 1 wherein said C-arm mount comprises a guide rail mounted at said exterior of said magnetic resonance scanner, and a C-arm having a leg with rollers supported on said guide rail.

5. A magnetic resonance apparatus as claimed in claim 1 wherein said C-arm mount is displaceable along a displacement path, and comprises an articulated C-arm that is pivotable around an axis disposed substantially parallel to said displacement path.

6. A magnetic resonance apparatus as claimed in claim 1 wherein said C-arm mount is displaceable between a park position and a working position, with said further gradient coil unit being disposed in said examination region when said C-arm mount is in said working position.

7. A magnetic resonance apparatus as claimed in claim 6 comprising an enclosure that covers said C-arm mount in said park position.

8. A magnetic resonance apparatus as claimed in claim 1 wherein said C-arm comprises at least one adjustable stop that limits displacement of said C-arm mount.

9. A magnetic resonance apparatus as claimed in claim 1 wherein said C-arm mount comprises an electrical drive that selectively positions said C-arm mount along a displacement path.

* * * * *